United States Patent [19]

Hartley

[11] 4,374,911

[45] Feb. 22, 1983

[54] PHOTO METHOD OF MAKING TRI-LEVEL DENSITY PHOTOMASK

[75] Inventor: Phillip A. Hartley, Vestal, N.Y.

[73] Assignee: International Business Machines Corporation, Armonk, N.Y.

[21] Appl. No.: 112,246

[22] Filed: Jan. 14, 1980

Related U.S. Application Data

[63] Continuation of Ser. No. 901,044, Apr. 28, 1978, abandoned.

[51] Int. Cl.³ ............................ G03C 5/04; G03F 1/00
[52] U.S. Cl. ..................................... 430/5; 430/4; 430/15; 430/22; 430/148
[58] Field of Search .................... 430/5, 4, 15, 22, 148

[56] References Cited

U.S. PATENT DOCUMENTS

| | | | |
|---|---|---|---|
| 3,202,509 | 8/1965 | Drake et al. | 430/5 |
| 3,666,463 | 5/1972 | Beynnon et al. | 430/22 |
| 3,674,487 | 7/1972 | Druschel | 430/22 |
| 3,744,904 | 7/1973 | Loprest et al. | 430/5 |
| 3,775,119 | 11/1973 | Bemis | 430/5 |

OTHER PUBLICATIONS

Habib, D. P., et al., "The Diazotype Process", Unconventional Photographic Systems, SPSE, 1964, pp. 113 and 126-133.

DeForest, W. S. "Photoresists", McGraw-Hill Book Co., 1975, pp. 151-153.

Primary Examiner—Charles L. Bowers, Jr.
Attorney, Agent, or Firm—Saul A. Seinberg

[57] ABSTRACT

A method of fabricating a photomask having at least three distinct zones of light transmissibility is disclosed. A first mask is made from a predetermined pattern, this mask having only two distinct zones of light transmissibility. A second mask, made by contact printing of a diazo film, is formed from a selected portion of one zone of the original pattern, which zone has the greater light transmissibility. The second mask, being a contact print, is the photographic opposite of the first. The two masks are then aligned with the selected portion of the second mask superimposed over its original location in the first mask and a composite latent image thereof is formed in a suitable emulsion. This composite image is then developed and fixed on an appropriate support to form a photomask having at least three density zones.

2 Claims, 16 Drawing Figures

PHOTO METHOD OF MAKING TRI-LEVEL DENSITY PHOTOMASK

This is a continuation of application Ser. No. 901,044, filed Apr. 28, 1978, now abandoned.

BACKGROUND OF THE INVENTION

1. Field of the Invention

This invention relates to a method of fabricating a photomask for use in personalizing a dielectric substrate and pertains, more particularly, to a photomask having at least three zones of light transmissibility therein. Such a photomask would be employed in permanently transferring artwork images, usually representative of electronic circuitry, to a metalized ceramic substrate.

2. Description of the Prior Art

The personalizing of a ceramic or any other dielectric substrate with the pads, lands and lines of electronic circuitry usually requires stratification of more than one metal to satisfy such diverse requirements as adequate adhesion, conductivity and corrosion resistance. Often the multi-metal strata must be complete in some areas and partial in others as dictated by design requirements. Photofabrication of such circuitry elements required several etching and/or deposition steps in varying locations on the single substrate surface.

This requirement led, in turn, to the need for multiple photoresist applications to mask off on location or pattern while exposing another. In attempting to reduce the number of photoprocess steps, which would result in obvious savings of time and money, attention was first focused on attempts to "double-process" a single resist layer (see *International Business Machines Technical Disclosure Bulletin*, Volume 14, No. 6, Page 1929, November 1971). Generally, this involved the exposure and development of certain areas using a positive resist, subsequent etching or plating, exposure and developing of other areas using the same photoresist and a second plating or etch step. This improvement only eliminated a stripping and reapplication step. The costly alignment and exposure steps still had to be repeated.

OBJECTS AND SUMMARY OF THE INVENTION

Accordingly, it is a principal object of the present invention to amend the prior art photofabrication process described above so that less time consuming, repetitive steps are required.

It is also a principal object of the present invention to subject a single photoresist layer to varying levels of radiation with a single exposure.

It is another object of the present invention to fabricate a photomask which will permit a single predetermined, graduated and selective exposure of a photoresist layered metalized substrate.

The foregoing and other objects and advantages are accomplished in accordance with one aspect of the invention fabricating a mask having zones of light or radiation transmissibility of effectively zero and one hundred percent and at least one zone of intermediate transmissibility. The mask is made by first forming a mask from a predetermined pattern which mask has only two zones of differing light transmissibility and then forming a second mask from a selected portion of one zone of the pattern having the greater light transmissibility with the second mask being the photographic opposite of the first. After the two masks are aligned so that the selected portion of the second mask is superimposed over its own location in the first mask, a composite latent image of the two aligned masks is formed by the appropriate projection of light therethrough onto a suitable emulsion. The composite latent image is then developed and fixed to form a patterned photomask having at least three different zones of light transmissibility.

DESCRIPTION OF THE PREFERRED EMBODIMENT

Figure 1:
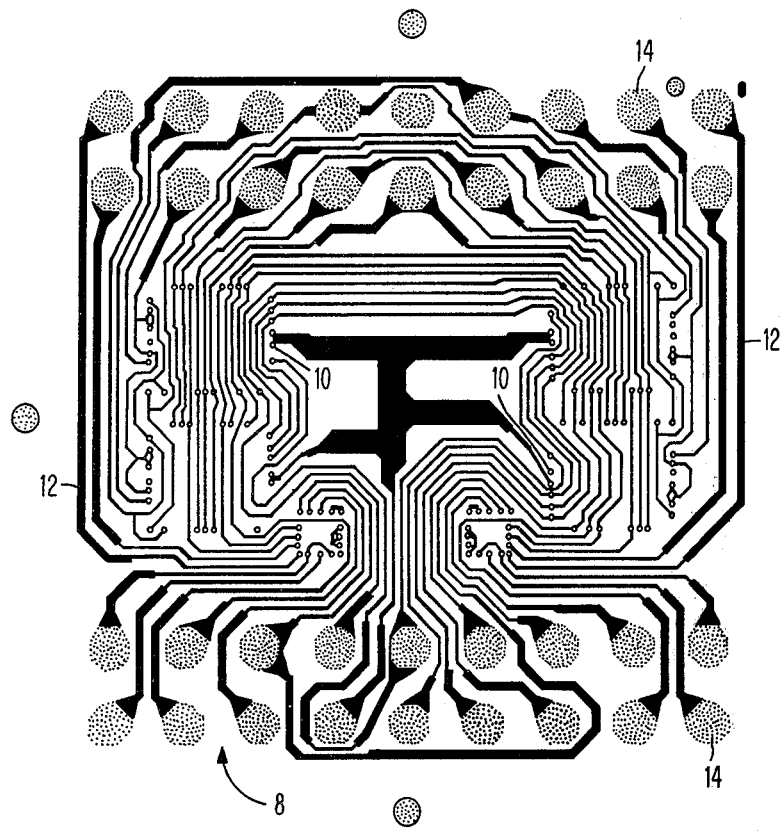
FIG. 1 shows a typical artwork pattern which is to be personalized in a metalized ceramic substrate with the aid of a photomask fabricated in accordance with the present invention.

Referring now to the drawings wherein like reference numerals have been used in the several view for like elements, FIG. 1 shows an artwork pattern 8 which is to be personalized on a metalized ceramic substrate. The particular pattern 8 shown in FIG. 1 is typical of the intricately detailed artwork encountered in implementing the required interconnections of modern technologies such as large scale integration or LSI. The pads 10 (shown in FIG. 1 as small open circles), lines 12 and lands 14 (shown in FIG. 1 as stippled circles) must be accurately positioned and sharply reproduced in a relatively quick manner to meet assembly line techniques. These seemingly conflicting requirements are readily accommodated by the present invention.

The original artwork is enlarged five times its actual size and is imaged onto a glass plate 16 which is used as the first mask in forming the tri-level density photomask. Plate 16 includes the glass support medium and a standard lithographic photographic emulsion. In preparing the first mask, an Eastman Kodak Company "Ortho Plate PFO" has been employed, although any other commercially available substitute would be usable.

Figure 2A:
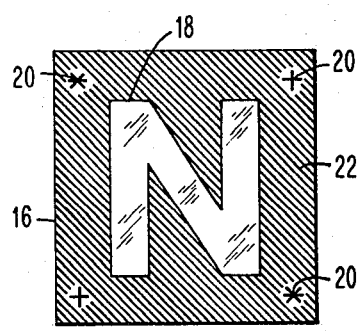
FIGS. 2a–2d schematically illustrate the starting and intermediate masks used in fabricating a photomask in accordance with the present invention.
Figure 3A:
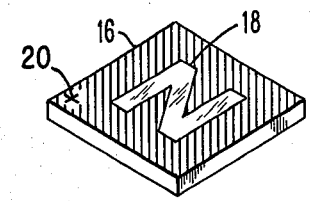
FIGS. 3a–3d schematically depict the use of the starting and intermediate masks in fabricating a photomask according to the present invention.

When developed, plate 16 yields a positive mask wherein the desired pattern 8 is opaque and the background is clear; that is, plate 16 exhibits two zones of light transmissibility. Reverse etching after development changes plate 16 to a negative mask wherein the pattern 8 is now clear and the background is opaque. As finished, plate 16 is illustrated in FIG. 2a. For the sake of clarity and simplicity, the original and intricate pattern 8 has been replaced by a pattern 18 which is more suitable for explanatory purposes. However, it should be noted that while pattern 18, a block letter "N", is simpler than pattern 8, this substitution in no way affects the methodology employed in fabricating the tri-level density mask. The negative plate 16 includes some registration and orientation marks 20, the clear pattern 18 and the opaque background 22. It should be noted that instead of reverse etching the positive plate 16, a contact print thereof can be made in a conventional manner, to yield a negative of the original pattern 8. An isometric view of plate 16 is shown in FIG. 3a.

Figure 2B:
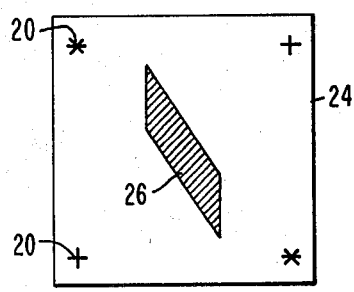

The next step involves a mylar sheet 24 having a standard lithographic film emulsion coated thereon. A selected portion 26 of the pattern 8 is imaged onto the sheet 24, developed and fixed. In FIG. 2b, the selected portion 26 of pattern 18 is the diagonal cross-bar of the "N", while for the original pattern 8, the selected portion would be the pads 10 and lands 12. In order to insure adequate coverage, the lands of the selected portion, that which is imaged onto sheet 24, are slightly larger than their counterparts in the original portion of the pattern from which they are derived. It should also be noted that the selected portion, in both instances, has been chosen from a part of the zone of mask 16 having the greater light transmissibility. The mylar sheet 24 serves as a temporary or intermediate mask in the overall process for fabricating the final, tri-level density mask, as is explained hereinafter.

Figure 3B:
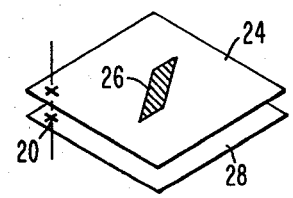
Figure 3C:
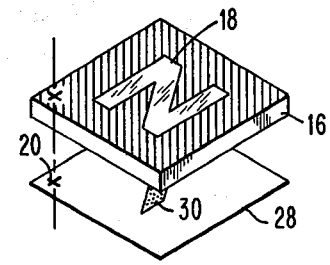

A mylar sheet 28 having an diazo film emulsion coated thereon is then used in conjunction with sheet 24 to make a contact print of the selected portion 26 on the sheet 28. As shown in FIG. 3b, the sheets 24 and 28 are placed together in alignment and irradiated with a light source (not shown) in a conventional manner. The exposure time must be of sufficient duration to insure that the diazo emulsion is adequately irradiated and thereby deactivated in all areas except for the selected pattern 30. The diazo emulsion is of a type which blocks ultraviolet wavelengths. The diazo sheet 28, after being conventionally developed by exposure to a basic atmosphere, such as ammonia, forms a second mask having a selected portion 30 of an original pattern 18 thereon, maximally developed to a minimal predetermined degree of light transmissibility. The use of diazo film to make the second mask is predicated on its uniform density when developed and the fact that it cannot be overdeveloped, to thereby yield superior contact prints than those attainable with silver halide emulsions.

The masks 16 and 28 are now aligned by means of the registration marks 20 with the selected portion 30 of the mask 28 superimposed over its original location in pattern 18. The resulting sandwich is then clamped and illuminated causing a composite latent image thereof to be formed in the lithographic emulsion of plate 32. Because the selected pattern portion 30 of the second mask 28 blocks ultraviolet light and, further, because the lithographic emulsion on plate 32 is made to be most sensitive to ultraviolet light, the time and/or intensity of exposure can be used to control the "grayness" of opacity as it appears in the final photomask 32. Plates 32 and 16 are of an identical type. Plate 32 is then developed and the developed latent image fixed in a conventional manner to form a positive tri-level density photomask.

Figure 2C:
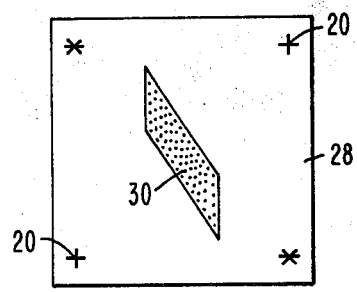
Figure 2D:
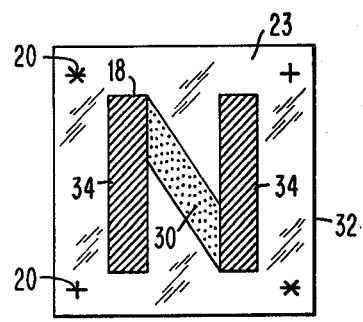
Figure 3D:
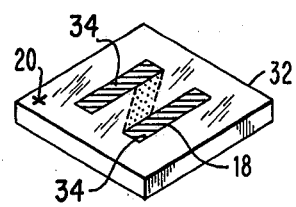

As is shown in FIGS. 2d and 3d, the bars 34 of pattern 18 are generally opaque and constitute a first zone of light transmissibility. The selected portion 30 is a predetermined shade of gray and constitutes a second zone of light transmissibility. Finally, the background 23 is now clear and constitutes a third zone of light transmissibility. It should be noted that the selected portion 30 of the second mask 28 could itself be divided and graduated to form more than one zone of light transmissibility or that, alternatively, more than one "gray" mask could be used to create a photomask having four or more zones of light transmissibility.

The finished photomask 32 is used in the following exemplary manner, as is sequentially shown in FIG. 4.

Figure 4A:
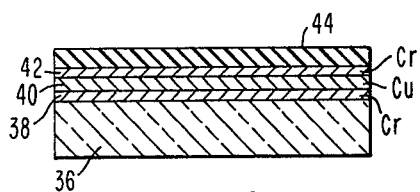
FIGS. 4a–4g show the photomask of FIG. 3d as it would be used in conjunction with the personalization of a metalized ceramic substrate.

A ceramic substrate 36 is coated by vacuum deposition or other suitable procedure with alternate layers, 38, 40, and 42 respectively, of chrome and copper. A layer 44 of positive photoresist is then coated onto the top chrome layer 42 as is shown in FIG. 4a. An appropriate tri-level density photomask 32' having three zones of light transmissibility, 23', 30' and 34', respectively, see FIG. 4b, is then placed over the coated substrate 36 atop the positive photoresist 44. The mask and substrate sandwich is then irradiated causing the photoresist to chemically respond thereto. Simply stated, this means that the photoresist will be very soluble in a given developer where it is maximally impinged by the radiation through the clear zone 23', the photoresist will be partially soluble in that developer where it is moderately impinged by the radiation through the gray or intermediate zone 30' and the photoresist will hardly be soluble, if at all, in that developer where it is not impinged because of the opaque zone 34'.

The mask 32' is now removed after only one exposure and one photoresist step with a saving as well in not having to strip photoresist more than once. The substrate is now placed in a solution of dilute or weak developer which is only capable of dissolving the photoresist impacted by the greatest amount of light, the area beneath the clear zone 23' of the mask 32'. The resulting change in the substrate is shown in FIG. 4c where the expected portion of the photoresist has been removed. The other portions of the photoresist are identified as 44a and 44b, respectively, and correspond to portions 34' and 30' of the mask 32'.

Figure 4D:
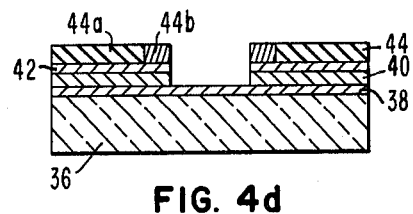
Figure 4B:
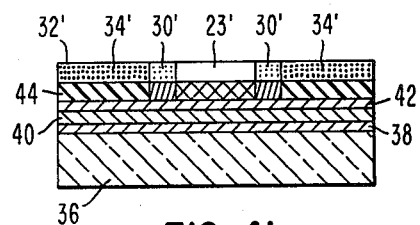
Figure 4E:
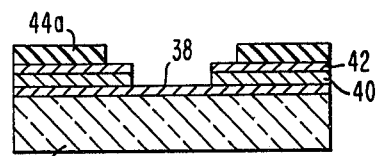
Figure 4F:
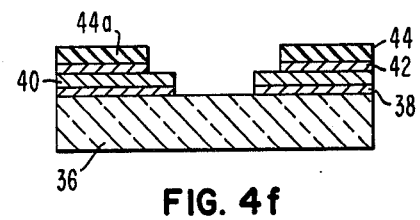
Figure 4C:
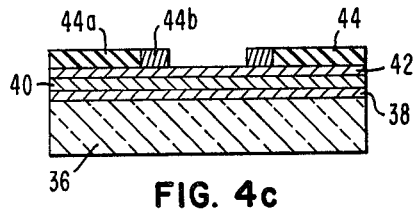
Figure 4G:
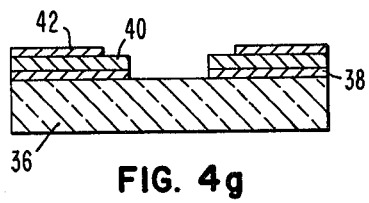

Next, the upper chrome layer 42 and the copper layer 40 are removed, see FIG. 4d, by etching. This etching step is obviously only effective in those areas where the photoresist has been dissolved. The etched substrate is now developed in a more concentrated developer which removes the moderately impacted photoresist portion 44b as shown in FIG. 4e. Thereafter, a chrome etch is undertaken which removes the upper chrome layer 42 where the moderately impacted photoresist has just been removed. This etch step, as is depicted in FIG. 4f, also removes the bottom chrome layer 38 to expose the substrate portion which was originally beneath the clear portion 23' of the photomask 32'. Finally, as illustrated in FIG. 4g, the photoresist is stripped leaving the metalized substrate personalized in accordance with a predetermined pattern and ready to receive an integrated chip, lead or pin.

While the present invention has been described in the context of the preferred embodiment thereof, it will be readily apparent to those skilled in the art that other modifications and variations can be made therein without departing from the spirit or scope of the invention. Accordingly, it is not intended that the present invention be limited to the specifics of the foregoing description of the preferred embodiment, but rather as being limited only by the scope of the invention as defined in the claims appended hereto.

Having thus described my invention, what I claim as new, and desire to secure by Letters Patent is:

1. A method of fabricating a patterned photomask having at least three zones of differing light transmissibility by the steps of:
 (a) forming a first mask from a predetermined pattern, said first mask having only two zones of differing light transmissibility when formed;

(b) forming a temporary mask from a selected portion of the zone of said pattern having the greater light transmissibility;
(c) forming a second mask by printing the photographic equivalent of said temporary mask on diazo film which blocks the transmission of ultraviolet light, said second mask being the photographic opposite of said first mask;
(d) aligning said first and second masks so that said selected portion of said second mask is superimposed over its own location in said first mask;
(e) forming a composite latent image of said aligned first and second masks by projecting light therethrough onto a suitable photographic emulsion; and
(f) developing and fixing said composite latent image to form said patterned photomask.

2. The method according to claim 1 which includes the additional steps of:

(a) forming another temporary mask from another selected portion of the zone of said pattern having the greater light transmissibility;
(b) forming a third mask by printing the photographic equivalent of said other temporary mask on a film which blocks the transmission of predetermined wavelengths of light, said third mask being the photographic opposite of said first mask and said other selected portion;
(c) developing said third mask to exhibit a different zone of light transmissibility than the zones of said first and second masks;
(d) aligning said first, second and third masks so that said selected portions of said second and third masks are superimposed over their own locations in said first mask; and
(e) forming a composite latent image of said aligned first, second and third masks by projecting light therethrough onto a suitable photographic emulsion.

* * * * *